United States Patent
Radosavljevic et al.

(10) Patent No.: US 8,633,470 B2
(45) Date of Patent: Jan. 21, 2014

(54) TECHNIQUES AND CONFIGURATIONS TO IMPART STRAIN TO INTEGRATED CIRCUIT DEVICES

(75) Inventors: Marko Radosavljevic, Beaverton, OR (US); Gilbert Dewey, Hillsboro, OR (US); Niloy Mukherjee, Beaverton, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 818 days.

(21) Appl. No.: 12/646,697

(22) Filed: Dec. 23, 2009

(65) Prior Publication Data

US 2011/0147706 A1 Jun. 23, 2011

(51) Int. Cl.
*H01L 29/06* (2006.01)

(52) U.S. Cl.
USPC ............... 257/18; 257/24; 257/29; 257/192; 257/194; 257/E21.403; 257/E29.248; 257/E29.252

(58) Field of Classification Search
USPC .............. 257/12, 14, 24, 183, 192, 194, 201, 257/200, 196, E29.247, E29.248, E29.249, 257/E29.25, E29.252, E29.253, E21.4, 257/E21.403, E21.404, E21.405, E21.407, 257/E21.408, E21.409, 18, 29; 438/167, 438/172
See application file for complete search history.

(56) References Cited

U.S. PATENT DOCUMENTS

| | | | |
|---|---|---|---|
| 5,783,478 A | | 7/1998 | Chau et al. |
| 5,844,261 A | * | 12/1998 | Kuo et al. .................... 257/194 |
| 6,373,112 B1 | | 4/2002 | Murthy et al. |
| 6,570,194 B2 | * | 5/2003 | Kato et al. .................... 257/194 |
| 6,621,131 B2 | | 9/2003 | Murthy et al. |
| 6,645,831 B1 | | 11/2003 | Shaheen et al. |
| 6,797,556 B2 | | 9/2004 | Murthy et al. |
| 6,812,086 B2 | | 11/2004 | Murthy et al. |
| 6,825,506 B2 | | 11/2004 | Jin et al. |
| 6,858,478 B2 | | 2/2005 | Chau et al. |
| 6,861,318 B2 | | 3/2005 | Murthy et al. |
| 6,885,084 B2 | | 4/2005 | Murthy et al. |
| 6,887,395 B2 | | 5/2005 | Hareland et al. |
| 6,897,098 B2 | | 5/2005 | Hareland et al. |
| 6,900,481 B2 | | 5/2005 | Jin et al. |
| 6,909,151 B2 | | 6/2005 | Hareland et al. |
| 6,914,295 B2 | | 7/2005 | Chau et al. |
| 6,933,589 B2 | | 8/2005 | Murthy et al. |

(Continued)

OTHER PUBLICATIONS

Awano, Y. et al., Performance and Principle of Operation of GaAs Ballistic Effect, 1983 IEEE, pp. 617-620.

(Continued)

*Primary Examiner* — Ermias Woldegeorgis
(74) *Attorney, Agent, or Firm* — Schwabe, Williamson & Wyatt, P.C.

(57) ABSTRACT

Embodiments of the present disclosure describe techniques and configurations to impart strain to integrated circuit devices such as horizontal field effect transistors. An integrated circuit device includes a semiconductor substrate, a first barrier layer coupled with the semiconductor substrate, a quantum well channel coupled to the first barrier layer, the quantum well channel comprising a first material having a first lattice constant, and a source structure coupled to the quantum well channel, the source structure comprising a second material having a second lattice constant, wherein the second lattice constant is different than the first lattice constant to impart a strain on the quantum well channel. Other embodiments may be described and/or claimed.

26 Claims, 7 Drawing Sheets

(56) References Cited

U.S. PATENT DOCUMENTS

| | | |
|---|---|---|
| 6,972,228 B2 | 12/2005 | Doyle et al. |
| 6,974,733 B2 | 12/2005 | Boyanov et al. |
| 6,974,738 B2 | 12/2005 | Hareland et al. |
| 7,005,366 B2 | 2/2006 | Chau et al. |
| 7,042,009 B2 | 5/2006 | Shaheen et al. |
| 7,105,390 B2 | 9/2006 | Brask et al. |
| 7,138,316 B2 | 11/2006 | Jin et al. |
| 7,145,246 B2 | 12/2006 | Hareland et al. |
| 7,176,075 B2 | 2/2007 | Jin et al. |
| 7,180,109 B2 | 2/2007 | Jin et al. |
| 7,193,279 B2 | 3/2007 | Doyle et al. |
| 7,235,809 B2 | 6/2007 | Jin et al. |
| 7,241,653 B2 | 7/2007 | Hareland et al. |
| 7,268,058 B2 | 9/2007 | Jin et al. |
| 7,279,375 B2 | 10/2007 | Radosavljevic et al. |
| 7,285,829 B2 | 10/2007 | Doyle et al. |
| 7,358,121 B2 | 4/2008 | Chau et al. |
| 7,429,747 B2 | 9/2008 | Hudait et al. |
| 7,435,683 B2 | 10/2008 | Kavalieros et al. |
| 7,435,987 B1 | 10/2008 | Chui et al. |
| 7,566,898 B2 | 7/2009 | Hudait et al. |
| 7,569,869 B2 | 8/2009 | Jin et al. |
| 7,601,980 B2 | 10/2009 | Hudait et al. |
| 2004/0113210 A1 | 6/2004 | Chau et al. |
| 2004/0191980 A1 | 9/2004 | Rios et al. |
| 2005/0124125 A1 | 6/2005 | Jin et al. |
| 2005/0145882 A1 | 7/2005 | Taylor et al. |
| 2005/0258451 A1* | 11/2005 | Saxler et al. ............ 257/192 |
| 2007/0123003 A1 | 5/2007 | Brask et al. |
| 2007/0138565 A1 | 6/2007 | Datta et al. |
| 2008/0029756 A1 | 2/2008 | Hudait et al. |
| 2008/0032478 A1 | 2/2008 | Hudait et al. |
| 2008/0064157 A1* | 3/2008 | Maeda et al. ............ 438/200 |
| 2008/0073639 A1 | 3/2008 | Hudait et al. |
| 2008/0076235 A1 | 3/2008 | Hudait et al. |
| 2008/0079094 A1 | 4/2008 | Jin et al. |
| 2008/0085580 A1 | 4/2008 | Doyle et al. |
| 2008/0116485 A1 | 5/2008 | Hudait et al. |
| 2008/0132081 A1 | 6/2008 | Shaheen et al. |
| 2008/0142785 A1 | 6/2008 | Dutta et al. |
| 2008/0142786 A1* | 6/2008 | Datta et al. ............ 257/24 |
| 2008/0169512 A1 | 7/2008 | Jin et al. |
| 2008/0203381 A1 | 8/2008 | Hudait et al. |
| 2008/0237573 A1 | 10/2008 | Jin et al. |
| 2008/0237575 A1 | 10/2008 | Jin et al. |
| 2008/0237577 A1 | 10/2008 | Chui et al. |
| 2008/0237719 A1 | 10/2008 | Doyle et al. |
| 2008/0237751 A1 | 10/2008 | Shah et al. |
| 2009/0001350 A1 | 1/2009 | Hudait et al. |
| 2009/0001441 A1 | 1/2009 | Jin et al. |
| 2009/0085062 A1 | 4/2009 | Jin et al. |
| 2009/0230478 A1 | 9/2009 | Pillarisetty et al. |
| 2010/0163847 A1* | 7/2010 | Majhi et al. ............ 257/24 |
| 2012/0199813 A1* | 8/2012 | Datta et al. ............ 257/20 |

OTHER PUBLICATIONS

Tomizawa, K. et al., Simulation of GaAs Submicron FET with Hot-Electron Injection Structure, Electronics Letters, Aug. 18, 1983, Vo. 19 No. 17, pp. 697-698.

Yamasaki, K et al., Electron Velocity Enhancement by Planar-Doped Barrier Source in GaAs Vertical FET, Electronics Letters, Oct. 27, 1988, vol. 24 No. 22, pp. 1383-1384.

Weinzierl, Steven R. et al., Heterojunction Vertical FET's Revisited: Potentional for 225-GHz Large-Current Operation, IEEE Transaction on Electron Devices, vol. 39, No. 5, May 1992, pp. 1050-1055.

Cea, S.M. et al., Front End Stress Modeling for Advance Logic Technologies, IEEE, 2004, pp. 963-966.

Giles, M.D. et al., Understanding Stress Enhanced Performance in Intel 90nm CMOS Technology, IEEE, 2004 Symposium on VLSI Technology Digest of Technical Papers, pp. 118-119.

Obradovic, B. et al., A Physically-Based Analytic Model for Stress-Induced Hole Mobility Enhancement, IEEE, 2004, pp. 26-27.

Shifren, L. et al., Drive current enhancement in p-type metal-oxide-semiconductor field-effect transistor under shear uniaxial stress, Applied Physics Letters, vol. 85, No. 25, Dec. 20, 2004, pp. 6188-6190.

Wang, Everett X. et al., Physics of Hole Transport in Strained Silicon MOSFET inversion Layers, IEEE Transaction on Electron Devices, vol. 53, No. 8, Aug. 2006, pp. 1840-1851.

Radosavljevic, Marko et al., Increasing Carrier Injection Velocity for Integrated Circuit Devices, U.S. Patent Application filed on Dec. 21, 2009 assigned U.S. Appl. No. 12/643,848.

International Search Report and Written Opinion for International Application No. PCT/US2010/058778.

Preliminary Rejection Issued in Korean Patent Application No. 2012-7016074, issued Jul. 19, 2013.

Office Action issued in Taiwan Patent Application No. 099140786, issued on May 30, 2013.

* cited by examiner

TECHNIQUES AND CONFIGURATIONS TO IMPART STRAIN TO INTEGRATED CIRCUIT DEVICES

FIELD

Embodiments of the present disclosure generally relate to the field of integrated circuits, and more particularly, to techniques and configurations to impart strain to integrated circuit devices such as horizontal field-effect transistors.

BACKGROUND

Generally, integrated circuit devices such as transistors are being formed in emerging semiconductor thin films such as, for example, group III-V semiconductor materials for electronic or optoelectronic devices. Increasing carrier mobility of such group III-V materials may increase a speed of integrated circuit devices formed therein.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide techniques and configurations to impart strain to integrated circuit devices such as horizontal field effect transistors. In the following detailed description, reference is made to the accompanying drawings which form a part hereof wherein like numerals designate like parts throughout, and in which is shown by way of illustration embodiments which may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use perspective-based descriptions such as horizontal/vertical, up/down, back/front, over/under, and top/bottom. Such descriptions may not restrict the application of embodiments described herein to a particular orientation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled" may be used to describe various relationships between components herein. For example, the term "coupled to" may generally refer to a more direct physical connection between components, unless otherwise expressed (e.g., "electrically coupled," "communicatively coupled," or "coupled to [perform a function]"). The term "coupled with" generally refers to a physical connection where other intervening components may or may not be present between such coupled components.

Figure 1:
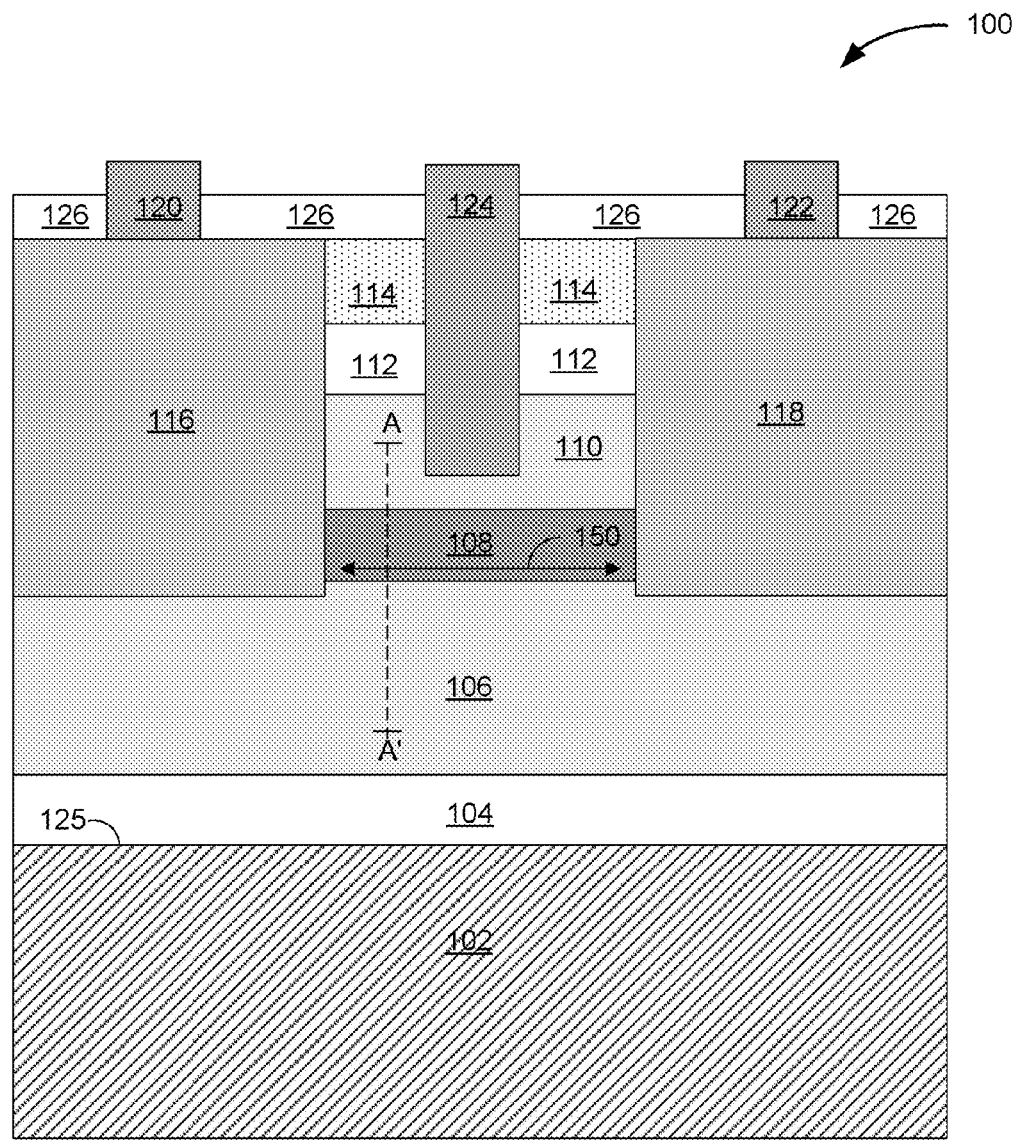
FIG. 1 schematically illustrates an example integrated circuit device in accordance with some embodiments.

FIG. 1 schematically illustrates an example integrated circuit device in accordance with some embodiments. In an embodiment, the integrated circuit device 100 includes a semiconductor substrate 102, one or more buffer films 104, a first barrier film 106, a quantum well channel 108, a second barrier film 110, an etch stop film 112, a contact film 114, a source structure 116, a drain structure 118, a source electrode 120, a drain electrode 122, a gate electrode 124, and a strain-inducing film 126, coupled as shown.

The semiconductor substrate 102 may include N-type or P-type (100) off-oriented silicon, the crystalline directions of the semiconductor substrate 102 being symbolized by the convention (xyz), where x, y, and z represent respective crystallographic planes in three dimensions that are perpendicular to one another. The semiconductor substrate 102 may, for example, include material of a (100) direction off-cut in a range between about 2 degrees to about 8 degrees towards a (110) direction. Other off-cut orientations or a substrate 102 without an off-cut orientation may be used. Off-cutting may eliminate anti-phase boundaries.

The semiconductor substrate 102 may have a high resistivity between about 1 Ω-cm to about 50 kΩ-cm. High resistivity may allow for device isolation of one or more integrated circuit devices (e.g., integrated circuit device 100) formed on an active surface 125 of the semiconductor substrate 102. The active surface 125 may be a substantially planar surface upon which integrated circuit devices (e.g., integrated circuit device 100) such as transistors are formed.

One or more buffer films 104 may be coupled to the semiconductor substrate 102. In an embodiment, the one or more buffer films 104 include a nucleation buffer film (not shown)

and a graded buffer film (not shown). The nucleation buffer film may be used, for example, to fill semiconductor substrate 102 terraces with atomic bi-layers of a semiconductor material including, for example, one or more group III-V semiconductor materials and/or one or more group II-VI semiconductor materials, or combinations thereof. A nucleation portion (not shown) of the nucleation buffer film may create a virtual polar semiconductor substrate 102. Such nucleation portion may, for example, have a thickness of about 3 nanometers (nm) to about 50 nm. A buffer film portion (not shown) of the nucleation buffer film may serve as a buffer against dislocation threading and/or provide control of a lattice mismatch of about 4% to about 8% between the semiconductor substrate 102 and the first barrier film 106. The buffer film portion of nucleation buffer film may, for example, have a thickness of about 0.3 microns to about 5 microns. The nucleation buffer film (e.g., the one or more buffer films 104) may include group III-V semiconductors and/or group II-VI semiconductors, such as gallium arsenide (GaAs). Other material systems may be used to form the nucleation buffer film including N-type or P-type material systems.

The one or more buffer films 104 may further include a graded buffer film (not shown) formed on the nucleation buffer film (not shown). The graded buffer film may include, for example, group III-V semiconductor materials and/or group II-VI semiconductor materials, or combinations thereof. For example, the graded buffer film may include indium aluminum arsenide ($In_xAl_{1-x}As$), where x has a value between 0 and 1, representing the relative composition of the elements. In one embodiment, x has a value between about 0 and about 0.52. In another embodiment, the graded buffer film includes indium aluminum antimonide (InAlSb).

Other material systems including N-type or P-type materials may be used for the graded buffer film in other embodiments. For example, the graded buffer film may include inverse graded InAlAs or indium gallium aluminum arsenide (InGaAlAs) to provide a larger bandgap for device isolation. Increasing the relative percentage of aluminum (Al) in the graded buffer film in such a material system may strategically increase strain (e.g., compressive strain) to the quantum well channel 108 to increase performance of the integrated circuit device 100.

The graded buffer film may also provide stress relaxation between the semiconductor substrate 102 and other lattice mismatched films, such as, for example, the first barrier film 106, to reduce threading dislocation defects in the integrated circuit device 100. The graded buffer film may, for example, have a thickness of about 0.5 microns to 2 microns. Other thicknesses may be used in other embodiments. The one or more buffer films 104 may include other buffer films, or techniques that provide similar function as described herein in other embodiments.

The one or more buffer films 104 may be epitaxially deposited. In an embodiment, the one or more buffer films are deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A first barrier film 106 may be coupled with the semiconductor substrate 102. For example, the first barrier film 106 may be coupled to the one or more buffer films 104 formed on the semiconductor substrate 102, as illustrated. The first barrier film 106 may include group III-V semiconductor materials and/or group II-VI semiconductor materials, or combinations thereof. In an embodiment, the first barrier film 106 includes indium aluminum arsenide ($In_xAl_{1-x}As$), where x has a value between 0 and 1, representing the relative composition of the elements. According to various embodiments, x has a value between about 0.5 and about 0.8. In another embodiment, the first barrier film 106 includes indium aluminum antimonide (InAlSb). In yet another embodiment, the first barrier film 106 includes indium phosphide (InP). Other material systems including N-type materials and/or P-type materials may be used for the first barrier film 106 in other embodiments.

The first barrier film 106 may include a material that has a higher bandgap than a material used for the quantum well channel 108. A thickness for the first barrier film 106 may be selected to provide a sufficient barrier to charge carriers in the quantum well channel 108. In an embodiment, the first barrier film 106 has a thickness of about 10 nm to about 200 nm. Other thicknesses for the first barrier film 106 may be used in other embodiments.

The first barrier film 106 may be epitaxially deposited. In an embodiment, the first barrier film 106 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A quantum well channel 108 may be coupled to the first barrier film 106. The quantum well channel 108 may include group III-V semiconductor materials and/or group II-VI semiconductor materials, or combinations thereof. In an embodiment, the quantum well channel 108 includes indium gallium arsenide ($In_xGa_{1-x}As$), where x has a value between 0 and 1, representing the relative composition of the elements. In an embodiment, x includes values between about 0.5 and about 0.8. In another embodiment, the quantum well channel 108 includes indium antimonide (InSb). The quantum well channel 108 may include various other material systems including N-type or P-type materials in other embodiments. The quantum well channel 108 provides a pathway for mobile charge carriers such as electrons or holes to move between a source structure 116 and a drain structure 118. According to various embodiments, the quantum well channel 108 provides electron mobility for N-type devices and/or provides hole mobility for P-type devices.

According to various embodiments, the quantum well channel 108 has a band gap energy that is relatively smaller than a band gap for the first barrier film 106 and the second barrier film 110. The quantum well channel 108 may have a thickness that provides channel conductance for the integrated circuit device 100. According to various embodiments, the quantum well channel 108 has a thickness of about 2 nm to about 15 nm. The quantum well channel 108 may have other thicknesses in other embodiments.

The quantum well channel 108 may be epitaxially deposited. In an embodiment, the quantum well channel 108 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A source structure 116 is coupled to provide mobile charge carriers (e.g., electrons or holes) for the quantum well channel 108. According to various embodiments, the source structure 116 includes a material having a lattice constant that is different (e.g., greater or smaller) than a lattice constant of a material used to form the quantum well channel 108 to impart a strain on the quantum well channel 108. The source structure 116 may be epitaxially coupled to the quantum well channel 108 to form a heterojunction such that the different lattice constant between the materials for the source structure 116 and the quantum well channel 108 creates a compressive or tensile strain on the quantum well channel 108. A material for the source structure 116 may be selected to provide a desired or sufficient conductivity and/or epitaxial connection with the quantum well channel 108 according to well-known band-gap engineering principles.

The source structure 116 may be coupled to horizontally inject the mobile charge carriers into the quantum well channel 108. For example, a strain imparted by the source structure 116 may increase an injection velocity of the mobile charge carriers in a direction that is substantially parallel with a direction (e.g., arrow 150) of current flow in the quantum well channel 108. The direction indicated by arrow 150 may be a longitudinal direction of the quantum well channel 108. A horizontal direction may refer to a direction (e.g., arrow 150) that is substantially parallel with the active surface (e.g., 125) of the semiconductor substrate 102 and/or substantially parallel with the longitudinal direction of the quantum well channel 108. That is, strain imparted by the source structure 116 may be a uniaxial strain in a direction that is substantially parallel with the active surface (e.g., 125) of the semiconductor substrate and/or substantially parallel with the longitudinal direction of the quantum well channel 108. According to various embodiments, the integrated circuit device 100 is a horizontal field-effect transistor, or a high electron mobility transistor, or combinations thereof. The integrated circuit device 100 may include other types of transistors that benefit from embodiments described herein, including non-planar transistors such as multi-gate transistors. The integrated circuit device 100 may be a transistor having a gate length of about 15 nm. Other gate lengths may be used in other embodiments.

Applying a strain to the quantum well channel 108 as described herein may reduce an effective mass and/or resistance of the quantum well channel 108, thereby increasing a velocity of mobile charge carriers in the quantum well channel 108. Increasing the velocity of the mobile charge carriers may improve direct current (DC) and radio frequency (RF) characteristics of the integrated circuit device 100.

The source structure 116 may be formed using a variety of materials including group III-V semiconductor materials and/or group II-VI semiconductor materials, or combinations thereof. In an embodiment, the source structure 116 includes gallium arsenide (GaAs). In another embodiment, the source structure 116 includes indium aluminum arsenide (InAlAs). According to various embodiments, the source structure 116 has a thickness of less than about 60 nm. The source structure 116 may have other thicknesses in other embodiments. In an embodiment, the source structure 116 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A drain structure 118 may be coupled to receive the mobile charge carriers from the quantum well channel 108. According to various embodiments, the drain structure 118 includes a material having a lattice constant that is different (e.g., greater or smaller) than a lattice constant of a material used to form the quantum well channel 108 to impart a strain on the quantum well channel 108. The drain structure 118 may be epitaxially coupled to the quantum well channel 108 to form a heterojunction such that the different lattice constant between the materials for the drain structure 118 and the quantum well channel 108 creates a compressive or tensile strain on the quantum well channel 108. A material for the drain structure 118 may be selected to provide a desired or sufficient conductivity and/or epitaxial connection with the quantum well channel 108 according to well-known band-gap engineering principles.

According to various embodiments, the drain structure 118 includes the same material as the source structure 116 to conjunctively increase or enhance the compressive or tensile strain applied to the quantum well channel 108 by the source structure 116. In an embodiment, a lattice constant for a material used to form the source structure 116 and/or the drain structure 118 is smaller than a lattice constant for a material used to form the quantum well channel 108 to impart a tensile strain that increases a velocity of electrons in an N-type integrated circuit device. In another embodiment, a lattice constant for a material used to form the source structure 116 and/or the drain structure 118 is larger than a lattice constant for a material used to form the quantum well channel 108 to impart a compressive strain that increases a velocity of holes in a P-type integrated circuit device.

The drain structure 118 may be formed using a variety of materials including group III-V semiconductor materials and/or group II-VI semiconductor materials, or combinations thereof. In an embodiment, the drain structure 118 includes gallium arsenide (GaAs). In another embodiment, the drain structure 118 includes indium aluminum arsenide (InAlAs). According to various embodiments, the drain structure 118 has a thickness of less than about 60 nm. The drain structure 118 may have other thicknesses in other embodiments. In an embodiment, the drain structure 118 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

The source structure 116 and/or the drain structure 118 may be doped with an impurity, according to various embodiments. For example, the source structure 116 and/or the drain structure 118 may be delta-doped, modulation doped and/or combinations thereof. For an N-type device, the source structure 116 and/or the drain structure 118 may be doped with silicon (Si), sulfur (S), tellurium (Te), or combinations thereof. For a P-type device, the source structure 116 and/or the drain structure 118 may be doped with beryllium (Be), carbon (C), or combinations thereof. Other impurities may be used to dope the source structure 116 and/or the drain structure 118 in other embodiments. According to one or more embodiments, the quantum well channel 108 may be undoped while the source structure 116 and/or the drain structure 118 are doped to create an N-type or P-type device. In such embodiment, the undoped quantum well-channel 108 may be a channel of the N-type or P-type device.

A second barrier film 110 may be coupled to the quantum well channel 108 to provide confinement for mobile charge carriers when they travel in the quantum well channel 108. The second barrier film 110 may comport with embodiments already described in connection with the first barrier film 110 including material types, thicknesses, and/or deposition techniques. According to various embodiments, the second barrier film 110 is a Schottky barrier layer for control of the quantum well channel 108 using the gate electrode 124. In an embodiment, the quantum well channel 108 is disposed between the first barrier film 110 and the second barrier film 110, as illustrated.

An etch stop film 112 may be coupled with the second barrier film 110. The etch stop film 112 may be used to facilitate formation of the gate electrode 124. The etch stop film 112 may include group III-V semiconductor materials and/or group II-VI semiconductor materials, or combinations thereof, including, for example, indium phosphide (InP), InAlSb, or suitable combinations thereof. Other material systems including N-type materials and/or P-type materials may be used for the etch stop film 112 in other embodiments.

In an embodiment, the etch stop film 112 has a thickness of about 2 nm to 15 nm. Other thicknesses for the etch stop film 112 may be used in other embodiments. In an embodiment, the etch stop film 112 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A contact film 114 may be coupled with the etch stop film 112. The contact film 114 may include group III-V semiconductor materials and/or group II-VI semiconductor materials, or combinations thereof, including, for example, InGaAs. Other material systems including N-type materials and/or P-type materials may be used for the contact film 114 in other embodiments. The contact film 114 may be doped to increase electrical conductivity of the contact film 114. For example, the contact film 114 may be delta-doped, modulation doped and/or combinations thereof. For an N-type device, the contact film 114 may be doped with silicon (Si), sulfur (S), tellurium (Te), or combinations thereof. For a P-type device, the contact film 114 may be doped with beryllium (Be), carbon (C), or combinations thereof. Other impurities may be used to dope the contact film 114 in other embodiments. Other structures described herein may be doped according to similar principles to affect conductivity or other physical or electrical properties.

In an embodiment, the contact film 114 has a thickness of about 5 to 50 nm. Other thicknesses of the contact film 114 may be used in other embodiments. In an embodiment, the contact film 114 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments. The integrated circuit device 100 may include other films and structures such as, for example, spacer films, doped films, other barrier films, and/or strain-inducing films, which may intervene between structures and features described herein, according to various embodiments.

A source electrode 120 and a drain electrode 122 may be coupled to the respective source structure 116 and the drain structure 122. A gate electrode 124 may be coupled to control the flow of mobile charge carriers in the quantum well channel 108. According to various embodiments, a gate dielectric (not shown) may be formed between the gate electrode 124 and the quantum well channel 108. The gate dielectric may include, for example silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, where x, y, and z represent suitable quantities of the respective elements. Other materials may be used in other embodiments for the gate dielectric.

The contact film 114 may be electrically insulated or isolated from the gate electrode 124 by a variety of techniques, including, for example, recessing the contact film 114 to form an air gap or depositing a spacer dielectric material between the gate electrode 124 and the contact film 114. In an embodiment, the second barrier film 110 is a Schottky barrier layer for the gate electrode 124 to provide a Schottky junction through which the gate electrode 124 may control the quantum well channel 108.

The gate electrode 124, the source electrode 120, and the drain electrode 122 may include a wide variety of suitable electrically conductive materials. For example, the electrodes 120, 122, 124 may include copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof. The electrodes 120, 122, 124 may include a metal nitride such as, for example, titanium nitride (TiN), tungsten nitride (WN), or tantalum nitride (TaN), or combinations thereof. The electrodes 120, 122, 124 may include a metal silicide such as, for example, titanium silicide (TiSi), tungsten silicide (WSi), tantalum silicide (TaSi), cobalt silicide (CoSi), platinum silicide (PtSi), nickel silicide (NiSi), or combinations thereof. The electrodes 120, 122, 124 may include a metal silicon nitride such as, for example, titanium silicon nitride (TiSiN), or tantalum silicon nitride (TaSiN), or combinations thereof. The electrodes 120, 122, 124 may include a metal carbide such as, for example, titanium carbide (TiC), zirconium carbide (ZrC), tantalum carbide (TaC), hafnium carbide (HfC), or aluminum carbide (AlC), or combinations thereof. The electrodes 120, 122, 124 may include a metal carbon nitride such as, for example, tantalum carbon nitride (TaCN), titanium carbon nitride (TiCN), or combinations thereof. Other suitable materials may be used in other embodiments for the electrodes 120, 122, 124 such as conductive metal oxides (e.g., ruthenium oxide).

A strain-inducing film 126 may be formed on or over the electrodes 120, 122, 124 and/or the contact film 114, the source structure 116, and the drain structure 118. According to various embodiments, the strain-inducing film 126 is an amorphous material that is blanket-deposited (e.g., deposited over and on all exposed structures of the integrated circuit device 100) by any of a variety of well-known deposition techniques to stress the deposited material such as plasma-enhanced chemical vapor deposition (PECVD) and/or low pressure chemical vapor deposition (LPCVD). Portions of the strain-inducing film 126 may be recessed or selectively removed to allow formation of conductive interconnects to be coupled with the electrodes 120, 122, 124. In the process of relaxing, the strain-inducing film 126 may transfer strain to underlying structures such as the quantum channel 108 of the integrated circuit device 100. According to various embodiments, the strain may be compressive for P-type integrated circuit devices or tensile for N-type integrated circuit devices. The strain-inducing film 126 may incorporate a variety of materials including, for example, silicon nitride or silicon oxide materials. In an embodiment, the strain-inducing film 126 has a thickness of about 10 nm. Other thicknesses may be used in other embodiments.

Figure 2:
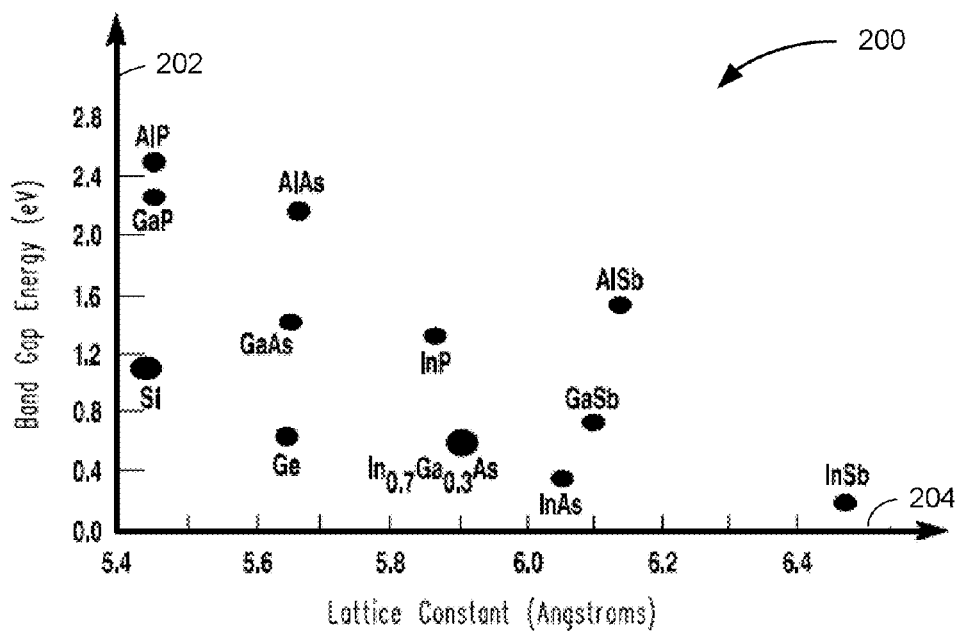
FIG. 2 provides a diagram of band gap energy and lattice constant for some example semiconductor materials in accordance with some embodiments.

FIG. 2 provides a diagram 200 of band gap energy and lattice constant for some example semiconductor materials in accordance with some embodiments. The band gap energy (eV) is depicted on a vertical axis 202 and a lattice constant (Angstroms) is depicted on a horizontal axis 204. The diagram 200 depicts some example semiconductor materials that may be used to fabricate the integrated circuit device 100 for visual comparison of respective band gap energies and lattice constants. For example, points are illustrated on the diagram 200 for indium antimonide (InSb), indium arsenide (InAs), indium gallium arsenide (InGaAs), germanium (Ge), gallium antimonide (GaSb), silicon (Si), indium phosphide (InP), gallium arsenide (GaAs), aluminum antimonide (AlSb), aluminum arsenide (AlAs), gallium phosphide (GaP), and aluminum phosphide (AlP). Materials for structures and features described herein may be selected to provide a desired or sufficient conductivity and/or epitaxial connection relative to adjacent structures and features according to well-known band-gap engineering principles.

The example semiconductor materials depicted in the diagram 200 are not intended to be an exhaustive representation of materials that can be used to form structures described herein. A wide variety of suitable materials, many of which may not be illustrated in the diagram 200, can be used to form structures described herein, including other combinations of the elements and compounds depicted in diagram 200.

Figure 3:
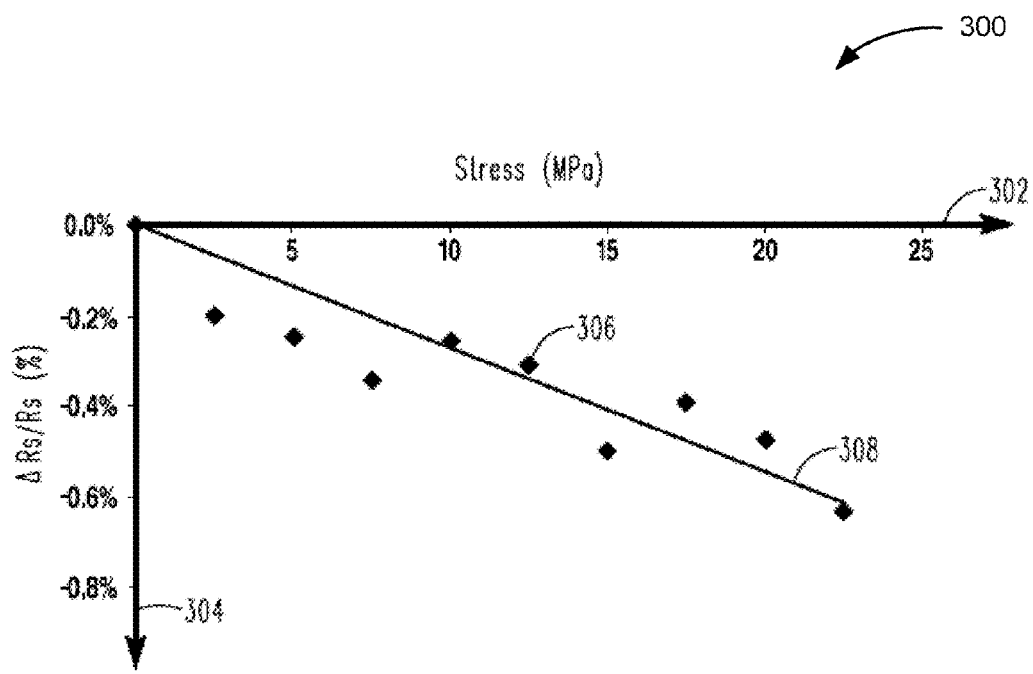
FIG. 3 provides a graph of stress and corresponding resistance for a group III-V semiconductor material.

FIG. 3 provides a graph 300 of stress and corresponding resistance for a group III-V semiconductor material. A horizontal axis 302 depicts stress in megapascals (MPa) and a vertical axis 304 depicts a change of resistance (Rs) in percentage (%) for an applied stress. The points 306 correspond with data collected from bending a wafer including indium gallium arsenide (InGaAs) to impart stress (e.g., longitudinal tension to spread atoms apart in a direction of current flow) on the InGaAs. The trend line 308 is a best fit line through the data points 306. The trend line 308 shows a general decrease in resistance (e.g., sheet resistance) with increasing stress, which may provide increased mobility of charge carriers in an N-type device.

Figure 4:
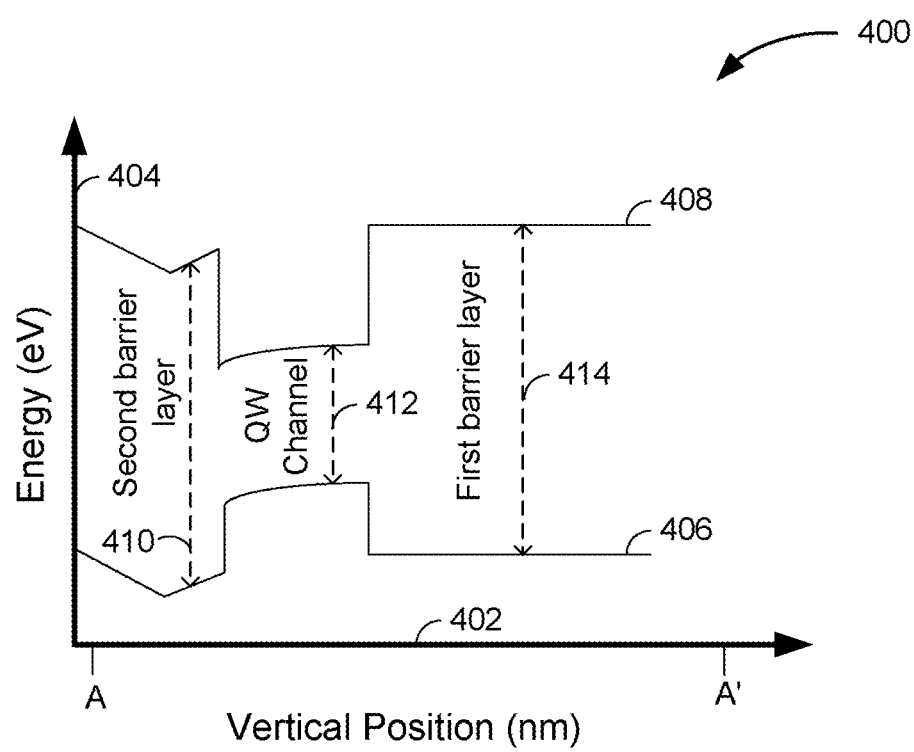
FIG. 4 provides a band gap energy diagram through a vertical direction of an integrated circuit device in accordance with some embodiments.

FIG. 4 provides a band gap energy diagram 400 through a vertical direction (e.g., from A to A') of the integrated circuit device 100. A horizontal axis 402 represents vertical position through the integrated circuit device 100 in nanometers (nm) and vertical axis 404 represents increasing energy in electron-volts (eV) in the direction of the vertical axis arrow. A valence band energy 406 and a conduction band energy 408 for materials between position A and position A' of the integrated circuit device 100 are depicted. As illustrated, a band gap energy 410 of the second barrier film (e.g., 110) is greater than a band gap energy 412 of the quantum well channel (e.g., 108) and a band gap energy 414 of the first barrier film (e.g., 106) is greater than the band gap energy 412 of the quantum well channel (e.g., 108). The first barrier film (e.g., 106) and the second barrier film (e.g., 110) may be doped with an impurity to provide confinement of mobile charge carriers to the quantum well channel (e.g., 108).

Figure 5:
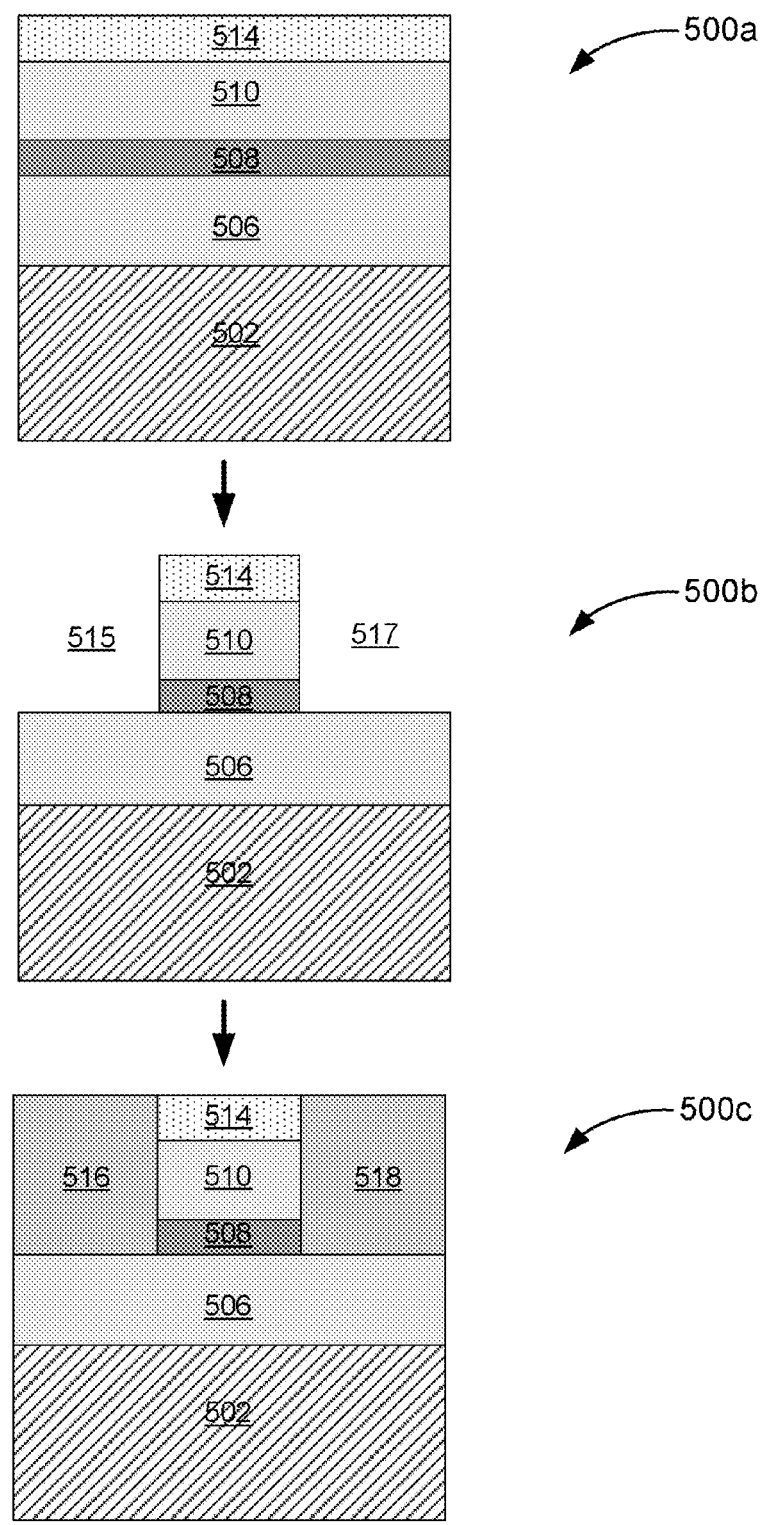
FIG. 5 schematically illustrates formation of a source structure and drain structure in a semiconductor heterostructure after various process operations in accordance with some embodiments.

FIG. 5 schematically illustrates formation of a source structure 516 and drain structure 518 in a semiconductor heterostructure 500a after various process operations in accordance with some embodiments. A semiconductor heterostructure 500a may be formed according to various techniques described herein. A first barrier film 506 may be formed and coupled with a semiconductor substrate 502. For example, the first barrier film 506 may be deposited on the semiconductor substrate 502 or on one or more buffer films (e.g., 104) formed on the semiconductor substrate 502.

A material for quantum well channel 508 may be deposited on or over the first barrier film 506, followed by deposition of a material for the second barrier film 510 on or over the quantum well channel 508. A contact film 514 may be deposited on or over the second barrier film 510 to form the semiconductor heterostructure 500a. The semiconductor heterostructure 500a may include other films and/or structures, including films described herein (e.g., etch stop film 112 of the integrated circuit device 100), that are omitted in FIG. 5 for the sake of clarity. The films 506, 510, 514, and the quantum well channel 508 may be epitaxially deposited.

In manufacturing product 500b, portions of the semiconductor heterostructure 500a are selectively removed to form a first recessed region 515 and a second recessed region 517. In an embodiment, portions of at least the contact film 514, the second barrier film 510, and the quantum well channel 508 are removed to form the first recessed region 515 and the second recessed region 517. In another embodiment, portions of the semiconductor heterostructure 500a are selectively removed prior to deposition of the contact film 514. In such embodiment, portions of at least the second barrier film 510 and the quantum channel 508 are removed to form the first recessed region 515. The contact film 514 may be subsequently deposited subsequent to formation of the first recessed region 515 and/or the second recessed region 517 according to various embodiments.

In an embodiment, the first recessed region 515 and the second recessed region 517 are simultaneously formed by an etching process. The first recessed region 515 and the second recessed region 517 may be separately formed in other embodiments. Other processes such as lithography or other patterning processes may be used to selectively remove portions of the semiconductor heterostructure 500a to form the first recessed region 515 and the second recessed region 517 in the manufacturing product 500b.

In manufacturing product 500c, a material is deposited to form a source structure 516 in the first recessed region 515 and a drain structure 518 in the second recessed region 517. The material of the source structure 516 and the drain structure 518 may have a lattice constant that is larger or smaller than a lattice constant of the material used to form the quantum well channel 508. According to various embodiments, material for the source structure 516 and the drain structure 518 is simultaneously deposited. The source structure 516 and the drain structure 518 may be separately formed in other embodiments. Material for the source structure 516 and/or the drain structure may be epitaxially deposited. The source structure 516 and the drain structure 518 may apply uniaxial strain (e.g., compressive or tensile) to the quantum well channel 508 according to techniques described herein to increase velocity of mobile charge carriers in an integrated circuit device (e.g., 100).

Figure 6:
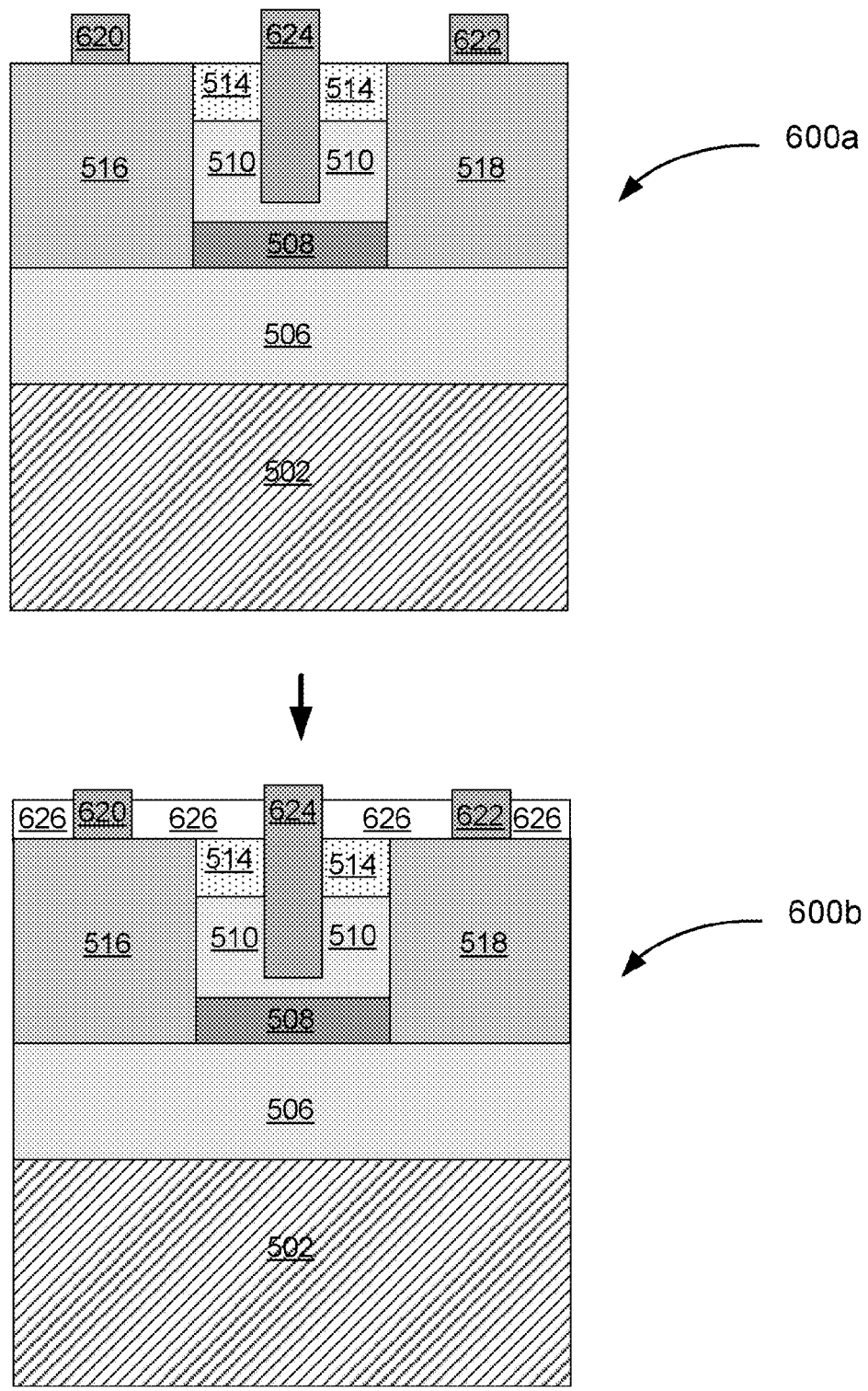
FIG. 6 schematically illustrates formation of electrode structures and a strain-inducing film on a semiconductor heterostructure after various process operations in accordance with some embodiments.

FIG. 6 schematically illustrates formation of electrode structures (e.g., 620, 622, 624) and a strain-inducing film (e.g., 626) on a semiconductor heterostructure (e.g., 500a) after various process operations in accordance with some embodiments. Manufacturing product 600a represents the manufacturing product 500c of FIG. 5 after formation of a source electrode 620, a drain electrode 622, and a gate electrode 624.

In manufacturing product 600a, the gate electrode 624 may be formed by selective removal (e.g., by etching and/or lithography) of portions of at least the contact film 514 and the second barrier film 510 to form a third recessed region (not shown). An etch stop film (e.g., 112) may be used to facilitate control of etching processes to form the third recessed region. A gate dielectric (not shown) may be deposited into the third recessed region, and a material to form the gate electrode 624 may be deposited on the gate dielectric. The contact film 514 may be recessed to electrically insulate the gate electrode 624 from the contact film 514 or to reduce leakage from the gate electrode 624 to the contact film 514. Gate electrode 624 may be electrically insulated from conductive elements (e.g., the contact film 514) in a variety of ways including by an air spacer, an insulating material such as silicon oxide or silicon nitride, or a high-k dielectric to line the sidewalls of the contact film 514. Other gate control techniques and structures may be used in other embodiments. For example, the second barrier film 510 may operate as a Schottky junction for control of the quantum well channel 508.

An electrode material may be deposited to form the source electrode 620 and the drain electrode 622. A variety of suitable deposition techniques including chemical vapor deposition, sputtering, and/or epitaxial deposition techniques may be used to deposit the electrodes 620, 622, 624. Patterning techniques such as lithography and/or etch processes may be used to selectively deposit the electrode material. In an embodiment, electrode material for the source electrode 620, the drain electrode 622, and the gate electrode 624 is deposited during the same deposition operation. In other embodiments, one or more of the electrodes 620, 622, 624 are formed during separate deposition operations.

In manufacturing product 600*b*, a strain-inducing film 626 is formed on or over the manufacturing product 600*a*. The strain-inducing film 626 may be deposited according to a variety of techniques to impart strain on the underlying structures, such as the quantum well channel 508, including, for example, plasma-enhanced chemical vapor deposition (PECVD) and/or low pressure chemical vapor deposition (LPCVD) methods to stress the material deposited to form the strain-inducing film 626. Portions of the strain-inducing film 626 may be recessed or selectively removed to allow formation of conductive interconnects to be coupled with the electrodes 620, 622, 624. According to various embodiments, the strain may be compressive for P-type integrated circuit devices or tensile for N-type integrated circuit devices. The strain-inducing film 626 may incorporate a variety of materials including, for example, silicon nitride or silicon oxide materials. In an embodiment, the strain-inducing film 626 has a thickness of about 10 nm. Other thicknesses may be used in other embodiments. Other well-known semiconductor structures and/or process operations may be used in fabricating the manufacturing product 600*b*.

Figure 7:
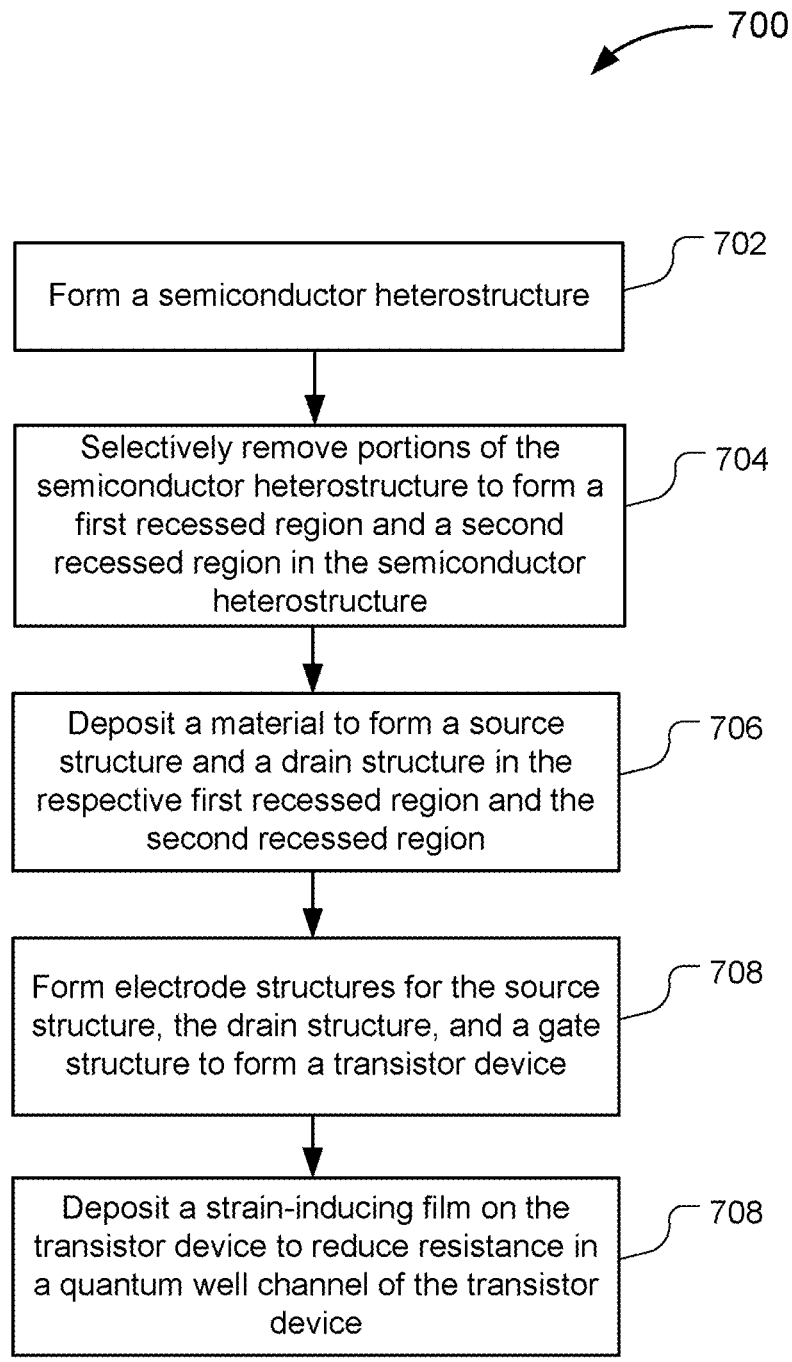
FIG. 7 is a flow diagram of a method for fabricating an integrated circuit in accordance with some embodiments.

FIG. 7 is a flow diagram of a method 700 for fabricating an integrated circuit (e.g., 100) in accordance with some embodiments. The method 700 includes forming a semiconductor heterostructure at block 702. The semiconductor heterostructure (e.g., 500*a*) can be formed according to a variety of techniques described herein. In an embodiment, the semiconductor heterostructure is formed by depositing a first barrier film on or over a semiconductor substrate, depositing a quantum well channel film on or over the first barrier film, depositing a second barrier film on or over the quantum well channel film, and/or depositing a contact film on or over the second barrier film. Other intervening films and/or structures may be deposited to form the semiconductor heterostructure. The films may be epitaxially deposited according to various embodiments.

At block 704, the method 700 further includes selectively removing portions of the semiconductor heterostructure to form a first recessed region and a second recessed region in the semiconductor heterostructure. For example, portions of the contact film, the second barrier film and/or the quantum well channel may be selectively removed. The selective removal may be performed by etch and/or lithography processes.

At block 706, the method 700 further includes depositing a material to form a source and a drain structure in the first recessed region and the second recessed region. The material used to form the source structure and the drain structure may be the same. In such case, the material may be deposited during the same deposition operation to form the source structure and the drain structure.

At block 708, the method 700 further includes forming electrode structures (e.g., 620, 622, 624) for the source structure, the drain structure, and a gate structure to form a transistor device (e.g., 100 or 600*a*). At block 710, the method 700 further includes depositing a strain-inducing film (e.g., 126 or 626) on the transistor device to reduce resistance in a quantum well channel (e.g., 108 or 508) of the transistor device. Method 700 may include other techniques and configurations described in connection with FIGS. 1-6.

Figure 8:
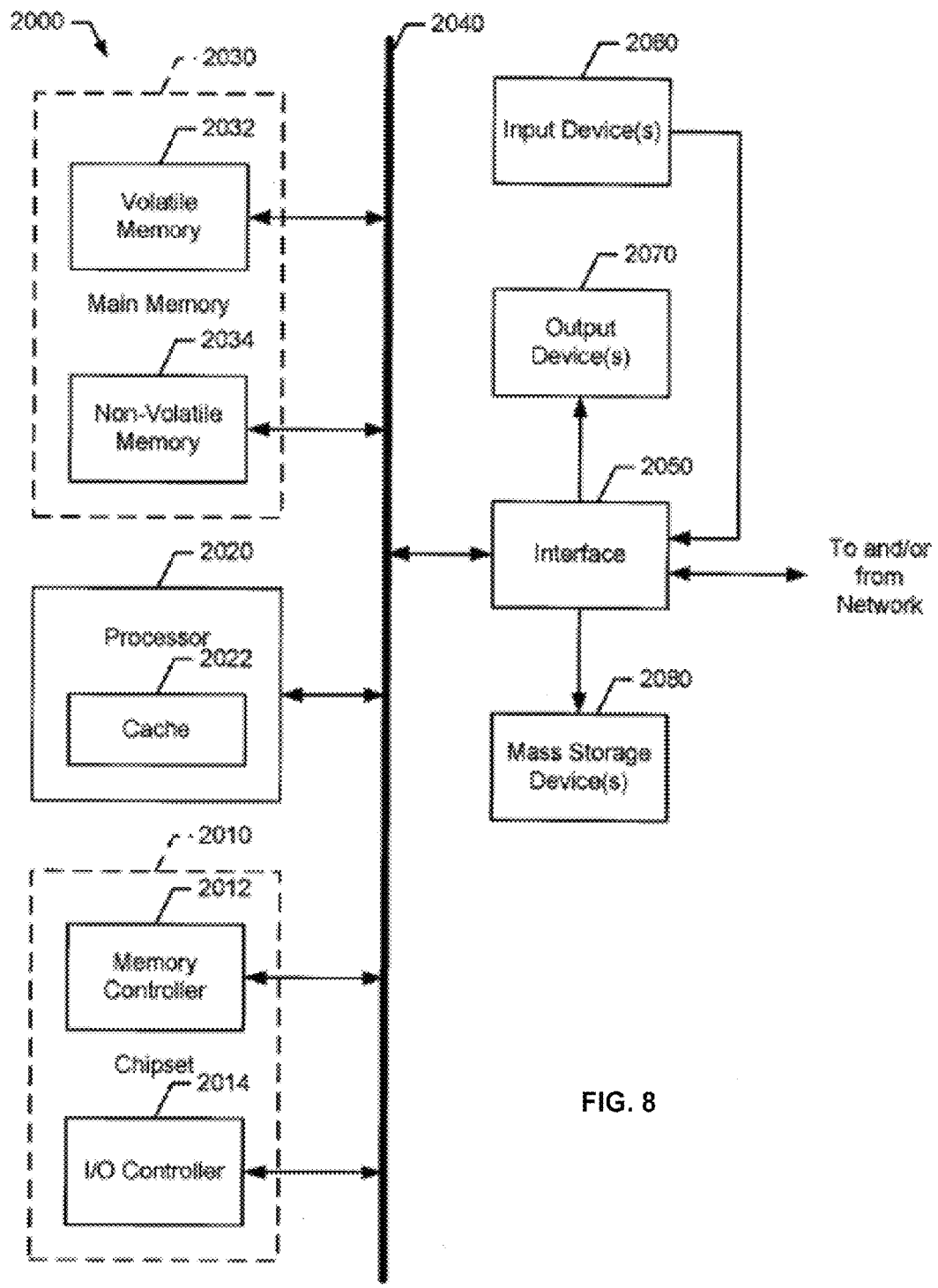
FIG. 8 schematically illustrates an example processor based system that may include an integrated circuit device as described herein in accordance with some embodiments.

FIG. 8 schematically illustrates an example processor based system 2000 that may include an integrated circuit device (e.g., 100) as described herein in accordance with some embodiments. The processor system 2000 may be a desktop computer, a laptop computer, a handheld computer, a tablet computer, a PDA, a server, an Internet appliance, and/or any other type of computing device.

The processor system 2000 illustrated in FIG. 8 includes a chipset 2010, which includes a memory controller 2012 and an input/output (I/O) controller 2014. The chipset 2010 may provide memory and I/O management functions as well as a plurality of general purpose and/or special purpose registers, timers, etc. that are accessible or used by a processor 2020. The processor 2020 may be implemented using one or more processors, WLAN components, WMAN components, WWAN components, and/or other suitable processing components. The processor 2020 may include a cache 2022, which may be implemented using a first-level unified cache (L1), a second-level unified cache (L2), a third-level unified cache (L3), and/or any other suitable structures to store data.

The memory controller 2012 may perform functions that enable the processor 2020 to access and communicate with a main memory 2030 including a volatile memory 2032 and a non-volatile memory 2034 via a bus 2040. While FIG. 8 shows a bus 2040 to communicatively couple various components to one another, other embodiments may include additional/alternative interfaces.

The volatile memory 2032 may be implemented by synchronous dynamic random access memory (SDRAM), dynamic random access memory (DRAM), RAMBUS dynamic random access memory (RDRAM), and/or any other type of random access memory device. The non-volatile memory 2034 may be implemented using flash memory, read only memory (ROM), electrically erasable programmable read only memory (EEPROM), and/or any other desired type of memory device.

The processor system 2000 may also include an interface circuit 2050 that is coupled to the bus 2040. The interface circuit 2050 may be implemented using any type of interface standard such as an Ethernet interface, a universal serial bus (USB), a third generation input/output interface (3GIO) interface, and/or any other suitable type of interface.

One or more input devices 2060 may be connected to the interface circuit 2050. The input device(s) 2060 permit an individual to enter data and commands into the processor 2020. For example, the input device(s) 2060 may be implemented by a keyboard, a mouse, a touch-sensitive display, a track pad, a track ball, an isopoint, and/or a voice recognition system.

One or more output devices 2070 may also be connected to the interface circuit 2050. For example, the output device(s) 2070 may be implemented by display devices (e.g., a light emitting display (LED), a liquid crystal display (LCD), a cathode ray tube (CRT) display, a printer and/or speakers). The interface circuit 2050 may include, among other things, a graphics driver card.

The processor system 2000 may also include one or more mass storage devices 2080 to store software and data. Examples of such mass storage device(s) 2080 include floppy disks and drives, hard disk drives, compact disks and drives, and digital versatile disks (DVD) and drives.

The interface circuit 2050 may also include a communication device such as a modem or a network interface card to facilitate exchange of data with external computers via a network. The communication link between the processor system 2000 and the network may be any type of network connection such as an Ethernet connection, a digital subscriber line (DSL), a telephone line, a cellular telephone system, a coaxial cable, etc.

In some embodiments, the processor system 2000 may be coupled to an antenna structure (not shown in the figure) to provide access to other devices of a network. In some embodiments, the antenna structure may include one or more directional antennas, which radiate or receive primarily in one direction (e.g., for 120 degrees), cooperatively coupled to one another to provide substantially omnidirectional coverage; or one or more omnidirectional antennas, which radiate or receive equally well in all directions. In some embodiments, the antenna structure may include one or more directional and/or omnidirectional antennas, including, e.g., a dipole antenna, a monopole antenna, a patch antenna, a loop antenna, a microstrip antenna or any other type of antennas suitable for OTA transmission/reception of RF signals.

Access to the input device(s) 2060, the output device(s) 2070, the mass storage device(s) 2080 and/or the network may be controlled by the I/O controller 2014. In particular, the I/O controller 2014 may perform functions that enable the processor 2020 to communicate with the input device(s) 2060, the output device(s) 2070, the mass storage device(s) 2080 and/or the network via the bus 2040 and the interface circuit 2050.

While the components shown in FIG. 8 are depicted as separate blocks within the processor system 2000, the functions performed by some of these blocks may be integrated within a single semiconductor circuit or may be implemented using two or more separate integrated circuits. For example, although the memory controller 2012 and the I/O controller 2014 are depicted as separate blocks within the chipset 2010, the memory controller 2012 and the I/O controller 2014 may be integrated within a single semiconductor circuit.

According to various embodiments, the processor 2020, the main memory 2030, or the chipset 2010, or combinations thereof, may include one or more integrated circuit devices (e.g., 100) or transistors that include features described herein. The one or more integrated circuit devices may include, for example, horizontal field-effect transistors, or high electron mobility transistors (HEMT), or combinations thereof. The processor 2020, the main memory 2030, or the chipset 2010 may include a P-type metal-oxide-semiconductor (PMOS) device and/or an N-type metal-oxide-semiconductor (NMOS) device.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
   a semiconductor substrate;
   a barrier layer coupled with the semiconductor substrate;
   a quantum well channel coupled to the barrier layer, the quantum well channel comprising a first material having a first lattice constant;
   a source structure coupled to the quantum well channel, the source structure comprising a second material having a second lattice constant,
   wherein the second lattice constant is different than the first lattice constant and the first material of the quantum well channel does not extend into the source structure;
   a drain structure coupled to the quantum well channel, the drain structure comprising the second material having the second lattice constant;
   a source electrode coupled to the source structure;
   a drain electrode coupled to the drain structure;
   a gate electrode coupled to control a current flow in the quantum well channel, the gate electrode being disposed between the source electrode and the drain electrode; and
   a strain-inducing film in direct contact with the second material of the source structure and the drain structure to reduce resistance of the quantum well channel by imparting a tensile or compressive strain on the quantum well channel, the tensile or compressive strain being in a direction that is substantially parallel with a longitudinal direction of the quantum well channel.

2. The apparatus of claim 1, wherein the barrier layer is a first barrier layer, the apparatus further comprising:
   a second barrier layer coupled to the quantum well channel such that the quantum well channel is disposed between the first barrier layer and the second barrier layer; and
   a contact layer coupled with the second barrier layer, wherein the strain-inducing layer is in direct contact with the contact layer.

3. The apparatus of claim 2, wherein the first barrier layer comprises a material having a bandgap energy that is greater than a bandgap energy of the quantum well channel; and
   wherein the second barrier layer comprises a material having a bandgap energy that is greater than the bandgap energy of the quantum well channel.

4. The apparatus of claim 2, further comprising one or more buffer layers epitaxially coupled to the semiconductor substrate, the first barrier layer being epitaxially coupled to the one or more buffer layers.

5. The apparatus of claim 2, wherein:
   the semiconductor substrate comprises silicon (Si),
   the first barrier layer comprises indium aluminum arsenide (InAlAs), or indium phosphide (InP), or combinations thereof,
   the first material of the quantum well channel comprises indium gallium arsenide (InGaAs),
   the second material of the source structure and the drain structure comprises gallium arsenide (GaAs),
   the second barrier layer comprises indium aluminum arsenide (InAlAs), or indium phosphide (InP), or combinations thereof, and
   the contact layer comprises indium gallium arsenide (InGaAs).

6. The apparatus of claim 1, wherein the second lattice constant is smaller than the first lattice constant to impart a tensile strain on the quantum well channel to increase a velocity of mobile charge carriers in the quantum well channel, the mobile charge carriers being electrons.

7. The apparatus of claim 6, wherein the quantum well channel is a channel of an N-type device.

8. The apparatus of claim 1, wherein the second lattice constant is larger than the first lattice constant to impart a compressive strain on the quantum well channel to increase a velocity of mobile charge carriers in the quantum well channel, the mobile charge carriers being holes.

9. The apparatus of claim 8, wherein the quantum well channel is a channel of a P-type device.

10. The apparatus of claim 1, wherein the second lattice constant is different than the first lattice constant to impart a uniaxial strain on the quantum well channel, the uniaxial strain being in a direction that is substantially parallel with a longitudinal direction of the quantum well channel to increase a velocity of mobile charge carriers in the quantum well channel.

11. The apparatus of claim 1, wherein:
the source structure is epitaxially coupled to the quantum well channel to form a heterojunction;
the drain structure is epitaxially coupled to the quantum well channel to form another heterojunction; and
the quantum well channel, the source structure, and the drain structure comprise a group III-V semiconductor, or a group II-VI semiconductor, or combinations thereof.

12. The apparatus of claim 1, wherein the quantum well channel is a channel of a horizontal field-effect transistor; and
wherein the horizontal field-effect transistor is a high electron mobility transistor (HEMT).

13. The apparatus of claim 1, wherein the strain-inducing film is planar.

14. A method comprising:
forming a semiconductor heterostructure comprising:
a semiconductor substrate,
a first barrier layer coupled with the semiconductor substrate,
a quantum well channel coupled to the first barrier layer, the quantum well channel comprising a first material having a first lattice constant, and
a second barrier layer coupled to the quantum well channel;
selectively removing portions of at least the second barrier layer and the quantum well channel to form a first recessed region and a second recessed region in the semiconductor heterostructure;
depositing a second material having a second lattice constant to form a source structure in the first recessed region and a drain structure in the second recessed region, wherein the second lattice constant is different than the first lattice constant and the first material of the quantum well channel does not extend into the source structure;
forming a source electrode on the source structure; forming a drain electrode on the drain structure; forming a gate electrode in the semiconductor heterostructure to control current flow in the quantum well channel, the gate electrode being disposed between the source electrode and the drain electrode; and
depositing a strain-inducing film directly on at least the second material of the source structure and the drain structure to reduce resistance of the quantum well channel by imparting a tensile or compressive strain on the quantum well channel, the tensile or compressive strain being in a direction that is substantially parallel with a longitudinal direction of the quantum well channel.

15. The method of claim 14, wherein forming the semiconductor heterostructure comprises:
depositing the first barrier layer on the semiconductor substrate or depositing the first barrier layer on one or more buffer layers epitaxially coupled to the semiconductor substrate;
depositing the first material on the first barrier layer to form the quantum well channel; and
depositing the second barrier layer on the quantum well channel.

16. The method of claim 15, wherein forming the semiconductor heterostructure further comprises depositing a contact layer on the second barrier layer;
wherein the strain-inducing layer is in direct contact with the contact layer; and
wherein selectively removing comprises selectively removing portions of at least the contact layer.

17. The method of claim 14, wherein depositing the second material is performed by molecular beam epitaxy (MBE), atomic layer epitaxy (ALE), epitaxial growth, chemical beam epitaxy (CBE), metal-organic chemical vapor deposition (MOCVD), or combinations thereof; and
wherein the first material and the second material comprise a group III-V semiconductor, a group II-VI semiconductor, or combinations thereof.

18. The method of claim 14, wherein depositing the second material having the second lattice constant to form the source structure and the drain structure imparts a uniaxial strain on the quantum well channel, the uniaxial strain being in a direction that is substantially parallel with a longitudinal direction of the quantum well channel to increase a velocity of the mobile charge carriers in the quantum well channel.

19. The method of claim 14, wherein selectively removing is performed by etching.

20. A system comprising:
a processor; and
a memory device coupled with the processor, wherein the processor or the memory device, or combinations thereof, comprise one or more transistors comprising:
a semiconductor substrate; a barrier layer coupled with the semiconductor substrate;
a quantum well channel coupled to the barrier layer, the quantum well channel comprising a first material having a first lattice constant;
a source structure coupled to the quantum well channel to inject mobile charge carriers into the quantum well, the source structure comprising a second material having a second lattice constant, wherein the second lattice constant is different than the first lattice constant to impart a strain on the quantum well channel and the first material of the quantum well channel does not extend into the source structure;
a drain structure coupled to the quantum well channel to receive the mobile charge carriers from the quantum well, the drain structure comprising the second material having the second lattice constant;
a source electrode coupled to the source structure; a drain electrode coupled to the drain structure; a gate electrode coupled to control a current flow in the quantum well channel, the gate electrode being disposed between the source electrode and the drain electrode; and
a strain-inducing film in direct contact with the second material of the source structure and the drain structure to reduce resistance of the quantum well channel by imparting a tensile or compressive strain on the quantum well channel, the tensile or compressive strain being in a direction that is substantially parallel with a longitudinal direction of the quantum well channel.

21. The system of claim 20, wherein the barrier layer is a first barrier layer, the system further comprising:
a second barrier layer coupled to the quantum well channel such that the quantum well channel is disposed between the first barrier layer and the second barrier layer; and a contact layer coupled with the second barrier layer, wherein the strain-inducing layer is in direct contact with the contact layer.

22. The system of claim 21, wherein:
the semiconductor substrate comprises silicon (Si),
the first barrier layer comprises indium aluminum arsenide (InAlAs), or indium phosphide (InP), or combinations thereof,
the first material of the quantum well channel comprises indium gallium arsenide (InGaAs),
the second material of the source structure and the drain structure comprises gallium arsenide (GaAs),
the second barrier layer comprises indium aluminum arsenide (InAlAs), or indium phosphide (InP), or combinations thereof, and
the contact layer comprises indium gallium arsenide (InGaAs).

23. The system of claim 20, wherein the second lattice constant is different than the first lattice constant to impart a uniaxial strain on the quantum well channel, the uniaxial strain being in a direction that is substantially parallel with a longitudinal direction of the quantum well channel to increase a velocity of the mobile charge carriers in the quantum well channel.

24. The system of claim 20, wherein the second lattice constant is smaller than the first lattice constant to impart a uniaxial tensile strain on the quantum well channel to increase a velocity of electrons in the quantum well channel; and wherein the quantum well channel is a channel of an N-type device.

25. The system of claim 20, wherein the second lattice constant is larger than the first lattice constant to impart a compressive strain on the quantum well channel to increase a velocity of holes in the quantum well channel; and wherein the quantum well channel is a channel of a P-type device.

26. The system of claim 20, wherein the one or more transistors comprise horizontal field-effect, high electron mobility transistors; and wherein the processor or the memory, or combinations thereof, comprise a P-type metal-oxide-semiconductor (PMOS) device and/or an N-type metal-oxide-semiconductor (NMOS) device.

* * * * *